United States Patent
Chiu et al.

(10) Patent No.: US 6,940,333 B2
(45) Date of Patent: Sep. 6, 2005

(54) HIGH-TO-LOW LEVEL SHIFTER

(75) Inventors: Pao-Cheng Chiu, Taipei Hsien (TW); Mu-Jung Chen, Kao-Hsiung (TW)

(73) Assignee: Realtek Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/708,327

(22) Filed: Feb. 24, 2004

(65) Prior Publication Data

US 2005/0012536 A1 Jan. 20, 2005

(30) Foreign Application Priority Data

Jul. 14, 2003 (TW) .......................... 92119174 A

(51) Int. Cl.[7] .............................................. H03L 5/00
(52) U.S. Cl. ........................................ 327/333; 326/80
(58) Field of Search ...................... 326/80, 81; 327/318, 327/319, 333

(56) References Cited

U.S. PATENT DOCUMENTS

| | | | | |
|---|---|---|---|---|
| 5,382,846 A | * | 1/1995 | Shigehara et al. ............ 326/68 |
| 5,399,920 A | * | 3/1995 | Van Tran ...................... 326/83 |
| 5,952,847 A | * | 9/1999 | Plants et al. .................. 326/80 |
| 6,252,422 B1 | * | 6/2001 | Patel et al. .................... 326/80 |
| 6,426,658 B1 | * | 7/2002 | Mueller et al. ............. 327/112 |

* cited by examiner

Primary Examiner—Jeffrey Zweizig
(74) Attorney, Agent, or Firm—Winston Hsu

(57) ABSTRACT

A high-to-low level shifter, coupled to a first external signal, for transforming the first external signal into an internal signal, wherein the first external signal substantially switches between a high-voltage-domain high potential and a high-voltage-domain low potential, the internal signal substantially switches between a low-voltage-domain high potential and a low-voltage-domain low potential. The high-to-low level shifter includes: an inverter, for generating a second external signal according to the first external signal, wherein the second external signal is inverse to the first external signal; and a level shifter, for generating the internal signal according to the first external signal and the second external signal.

28 Claims, 8 Drawing Sheets

HIGH-TO-LOW LEVEL SHIFTER

BACKGROUND OF INVENTION

1. Field of the Invention

The invention relates to a level shifter, and more particularly, to a level shifter for shifting the voltage level of a logic signal from a high operating voltage to a low operating voltage.

2. Description of the Prior Art

In an integrated circuit, because of the concerns of power and integration, the operating voltage of the integrated circuit is usually smaller than the operating voltage of an external system. Take an integrated circuit using 1.2V as the operating voltage as an example, 1.2V and 0V are used to represent logic value 1 and 0 respectively. But an external circuit usually uses higher voltage as the operating voltage than the integrated circuit. For example, the operating voltage of circuit elements on a motherboard is normally 5V or 3.3V, that is, 5V or 3.3V is used to represent logic value 1, while 0V is used to represent logic value 0. Accordingly, in an integrated circuit, a device must be set for shifting the level of a logic signal switching between 5V (or 3.3V) and 0V into a logic signal switching between 1.2V and 0V, which is termed "high-to-low level shifter" hereinafter.

In an integrated circuit, a component operating at 5V/3.3V is conventionally called high-voltage element; a component operating at 1.2V is conventionally called low-voltage element. Take a metal-oxide-semiconductor transistor (MOS transistor) as an example, being a high-voltage element or a low-voltage element is determined by the thickness of the oxide-layer of the MOS transistor. Generally speaking, a high-voltage MOS transistor has thicker oxide-layer than a low-voltage MOS transistor. Consequently, the threshold voltage of the high-voltage MOS transistor is larger than the threshold voltage of the low-voltage MOS transistor. Normally a high-voltage MOS transistor has a nominal threshold voltage of 0.9V.

Please refer to FIG. 1, a circuit diagram of a conventional high-to-low level shifter is illustrated. In FIG. 1 a high-to-low level shifter 100 is set inside an integrated circuit 150, and is coupled to an external circuit 180. The operating voltages of the external circuit 180 are: VDDH=3.3V, VSSH=0V, and the operating voltages of the integrated circuit 150 are: VDDL=1.2V, VSSL=0V. The high-to-low level shifter 100 includes: a high-voltage PMOS transistor 140 and a high-voltage NMOS transistor 160. Because the level shifter 100 receives the logic signal from the external circuit 180, the elements of the level shifter 100 are preferably high-voltage elements. When an external signal SH1 is at logic 1, its potential equals VDDH, the high-voltage NMOS transistor 160 will be turned on, and as a result the potential of an internal signal SL1 will be pulled down to VSSL. On the contrary, when the external signal SH1 is at logic 0, its potential equals VSSH, the high-voltage PMOS transistor 140 will be turned on, and as a result the potential of the internal signal SL1 will be pulled up to VDDL.

Please refer to FIG. 2, an example of logic signals in FIG. 1 is illustrated. From FIG. 2 it can be seen that under circumstances described above, logic signals can pass through the high-to-low level shifter 100 correctly.

But with advanced technology on integrated circuit processes, the operating voltage of the integrated circuit becomes smaller and smaller. For example, an integrated circuit produced through advanced technology can have operating voltage lower than 1.2, such as 0.9V or even lower. Under such circumstances the high-to-low level shifter 100 of FIG. 1 will probably pass logic signals wrongly.

Take VDDL=1V as an example (assume other parameters are unchanged). When the potential of the external signal SH1 equals VDDH, the potential of the internal signal SL1 will be pulled down to VSSL by the high-voltage NMOS transistor 160. However, when the potential of the external signal SH1 equals VSSH, even though the channel between the drain and the source of the high-voltage PMOS transistor 140 is turned on, the equivalent resistance of the channel is not small enough to be ignored, so it takes much more time for the internal signal SL1 to raise toward VDDL, and the switching time for the integrated circuit 150 is then increased. Under an extreme situation, while the operating frequency of the external signal SH1 is raised, each time when the potential of the external signal SH1 equals VSSL, the time period may not be enough for the potential of the internal signal SL1 to rise to VDDL. Under such circumstances the logic signal outputted (SL1) by the level shifter 100 will be incorrect as it is shown in FIG. 3.

When VDDL equals 0.9V, or even smaller than 0.9V (assume that other parameters are unchanged), because the threshold voltage of high-voltage elements is 0.9V, when the potential of the external signal equals VSSH, the channel of the high-voltage PMOS transistor 140 will not be turned on, and accordingly the logic signals outputted (SL1) by the level shifter 100 will be incorrect as it is shown in FIG. 4.

As depicted above, one difficulty the high-to-low level shifter in FIG. 1 faces is that logic signal probably can not pass through the high-to-low level shifter correctly when the operating voltage of the integrated circuit becomes smaller and smaller.

SUMMARY OF INVENTION

It is therefore one of the many objectives of the claimed invention to provide a high-to-low level shifter including an inverter and a level shifter.

According to the claimed invention, a high-to-low level shifter includes: an inverter for receiving an input signal and generating an inverse input signal, wherein the inverter operates using a first voltage; and a level shifter for generating an output signal according to the input signal and the inverse input signal, wherein the level shifter operates at a second voltage, the logic level of the output signal corresponds to the second voltage, and the logic value of the output signal corresponds to the input signal.

These and other objectives of the present invention will no doubt become obvious to those of ordinary skill in the art after reading the following detailed description of the embodiments that are illustrated in the various figures and drawings.

DETAILED DESCRIPTION

Figure 1:
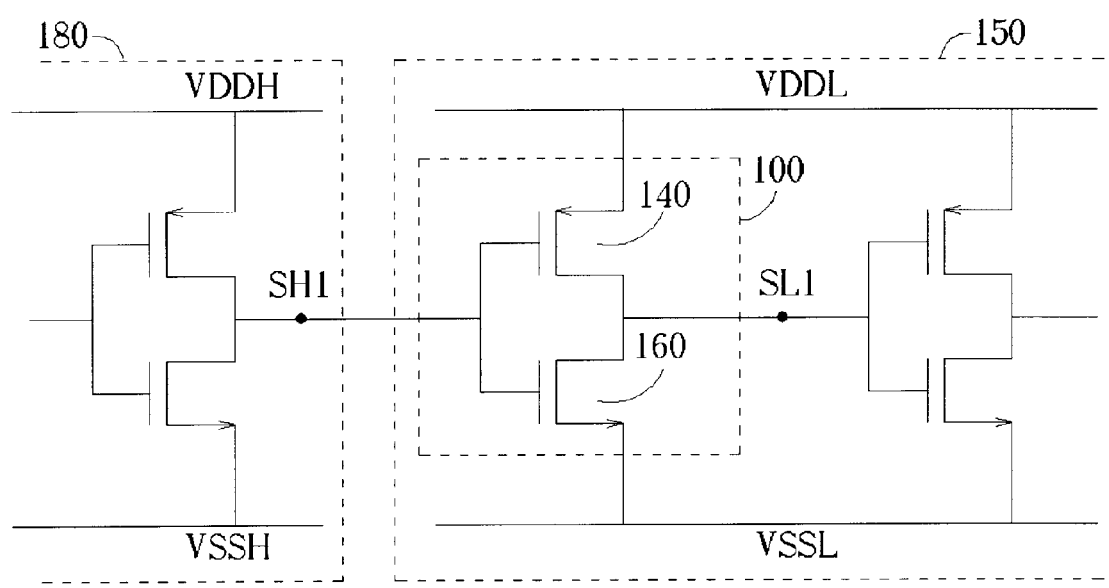
FIG. 1 is a circuit diagram of a conventional high-to-low level shifter.
Figure 2:
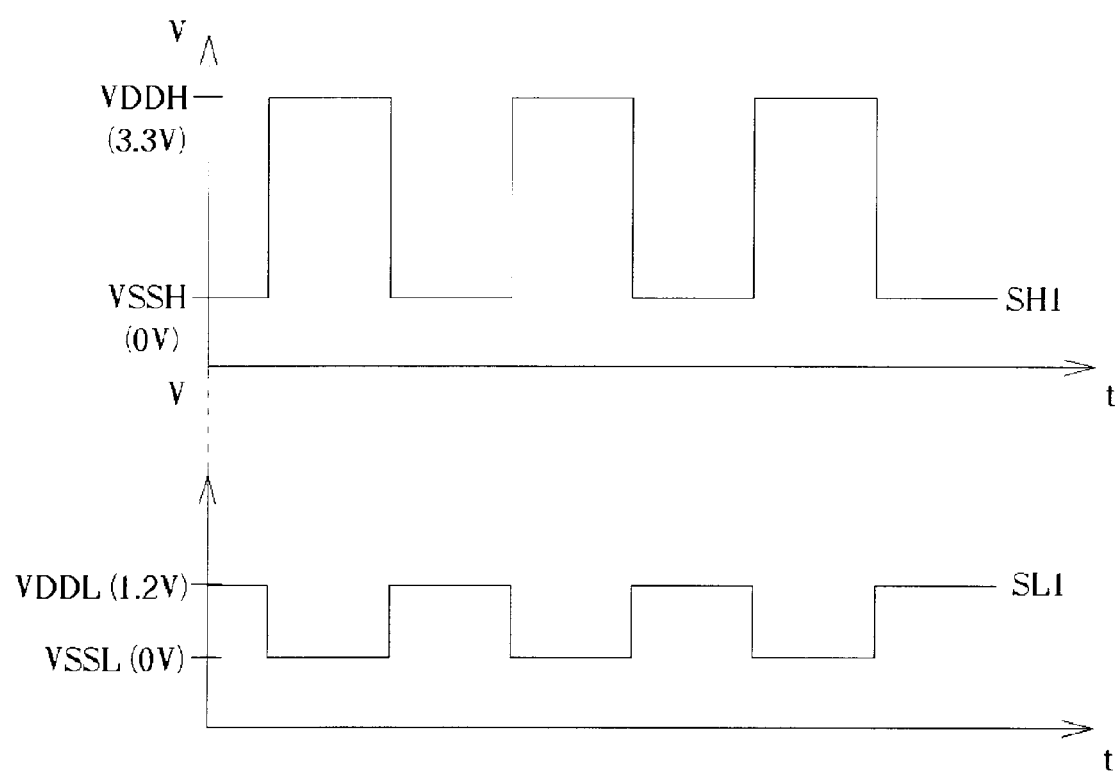
FIG. 2 is an example of logic signals in FIG. 1.
Figure 3:
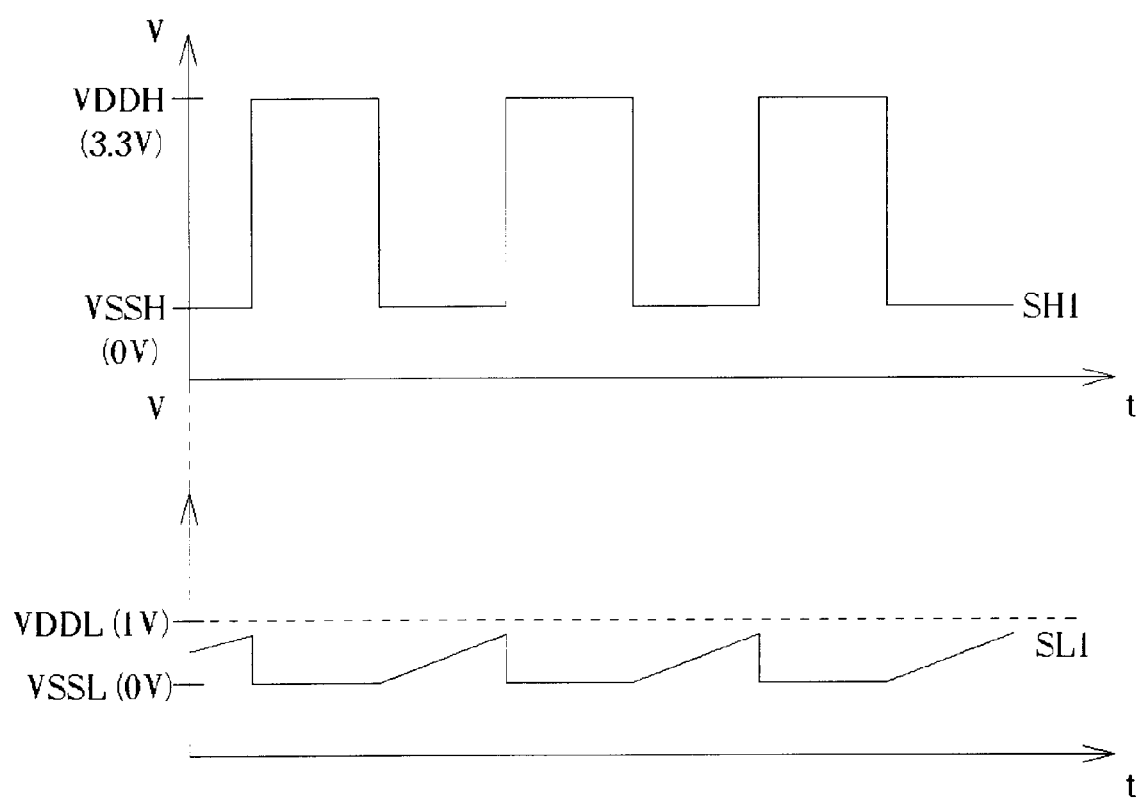
FIG. 3 is an example of logic signals in FIG. 1.
Figure 4:
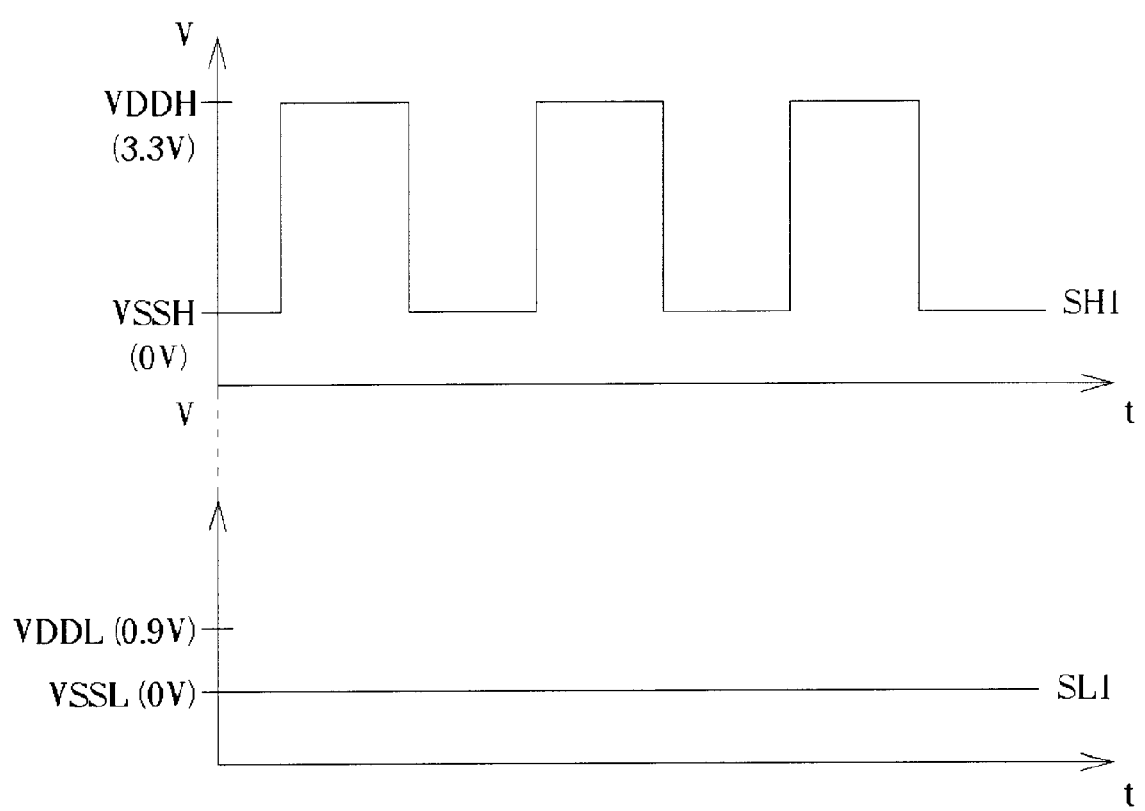
FIG. 4 is an example of logic signals in FIG. 1.
Figure 5:
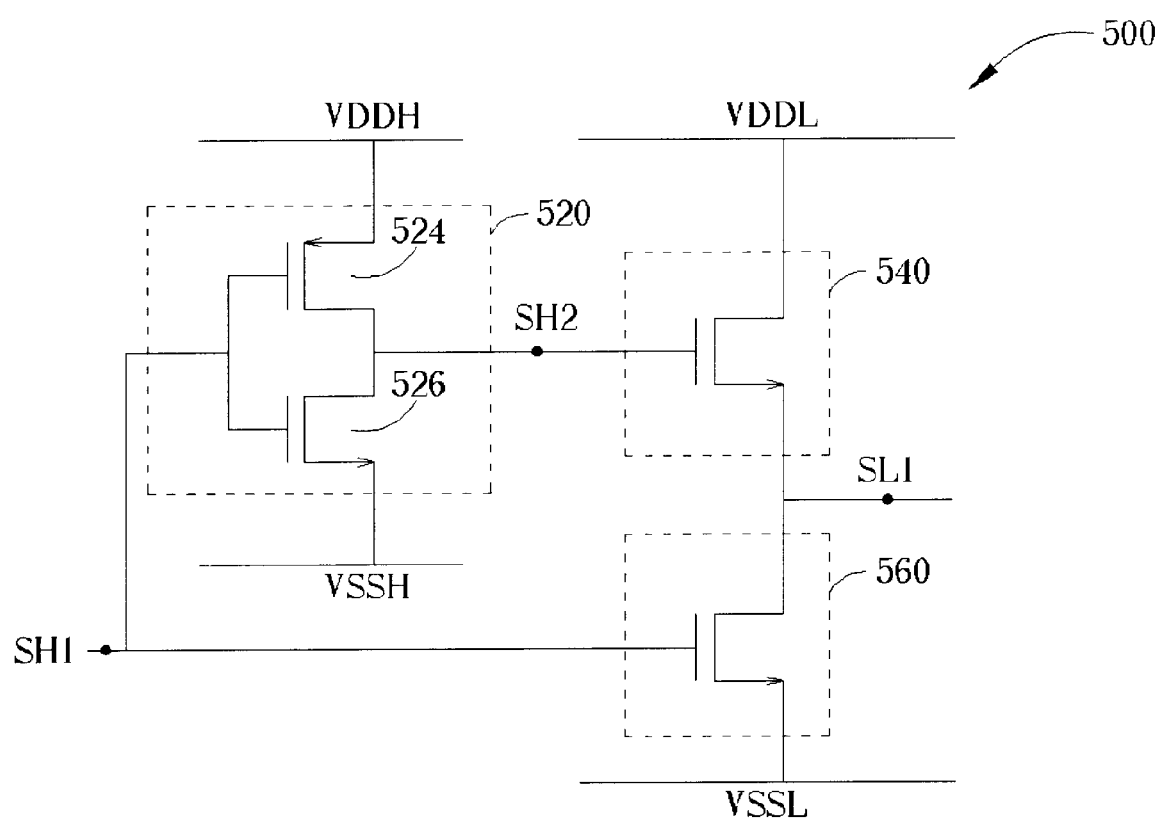
FIG. 5 is a circuit diagram of a high-to-low level shifter according to an embodiment of the present invention.

Please refer to FIG. 5, a circuit diagram of a high-to-low level shifter according to a first embodiment of the present invention is illustrated. A high-to-low level shifter 500 is coupled to an external first signal SH1, for shifting the level of the external first signal SH1 to become an internal signal SL1, wherein the potential of the external first signal SH1 substantially switches between VDDH (5V/3.3V) and VSSH (0V), while the potential of the internal signal SL1 substantially switches between VDDL (smaller than 0.9V in this embodiment) and VSSL (0V). The high-to-low level shifter 500 includes: an inverter 520, for receiving the external first signal SH1 and in turn generating an external second signal SH2; a pull-up element, which in this embodiment is a high-voltage NMOS transistor 540, coupled to the inverter 520; and a pull-down element, which in this embodiment is a high-voltage NMOS transistor 560, coupled to the external first signal SH1. In this embodiment, the inverter 520 is set inside as part of an external circuit, while the pull-up element 540 and the pull-down element 560 are set inside as part of an integrated circuit, and the pull-up element 540 and the pull-down element 560 are both high-voltage elements with threshold voltage equal to 0.9V.

When the external first signal SH1 is at logic 1, its potential substantially equals VDDH, and the inverter 520 outputs the external second signal SH2 with potential equals VSSH. Under such circumstances, the high-voltage NMOS transistor 560 will be turned on while the high-voltage NMOS transistor 540 will be turned off. Because at this time the channel of the high-voltage NMOS transistor 560 is equivalent to a small resistor, the potential of the internal signal SL1 will be pulled down to VSSL very fast.

On the contrary, when the external first signal SH1 is at logic 0, its potential substantially equals VSSH, and the inverter 520 outputs the external second signal SH2 with potential equals VDDH. Under such circumstances the high-voltage NMOS transistor 560 will be turned off while the high-voltage NMOS transistor 540 will be turned on. Because at this time the high-voltage NMOS transistor 540 is equivalent to a small resistor, the potential of the internal signal SL1 will be pulled up to VDDL very fast.

Figure 6:
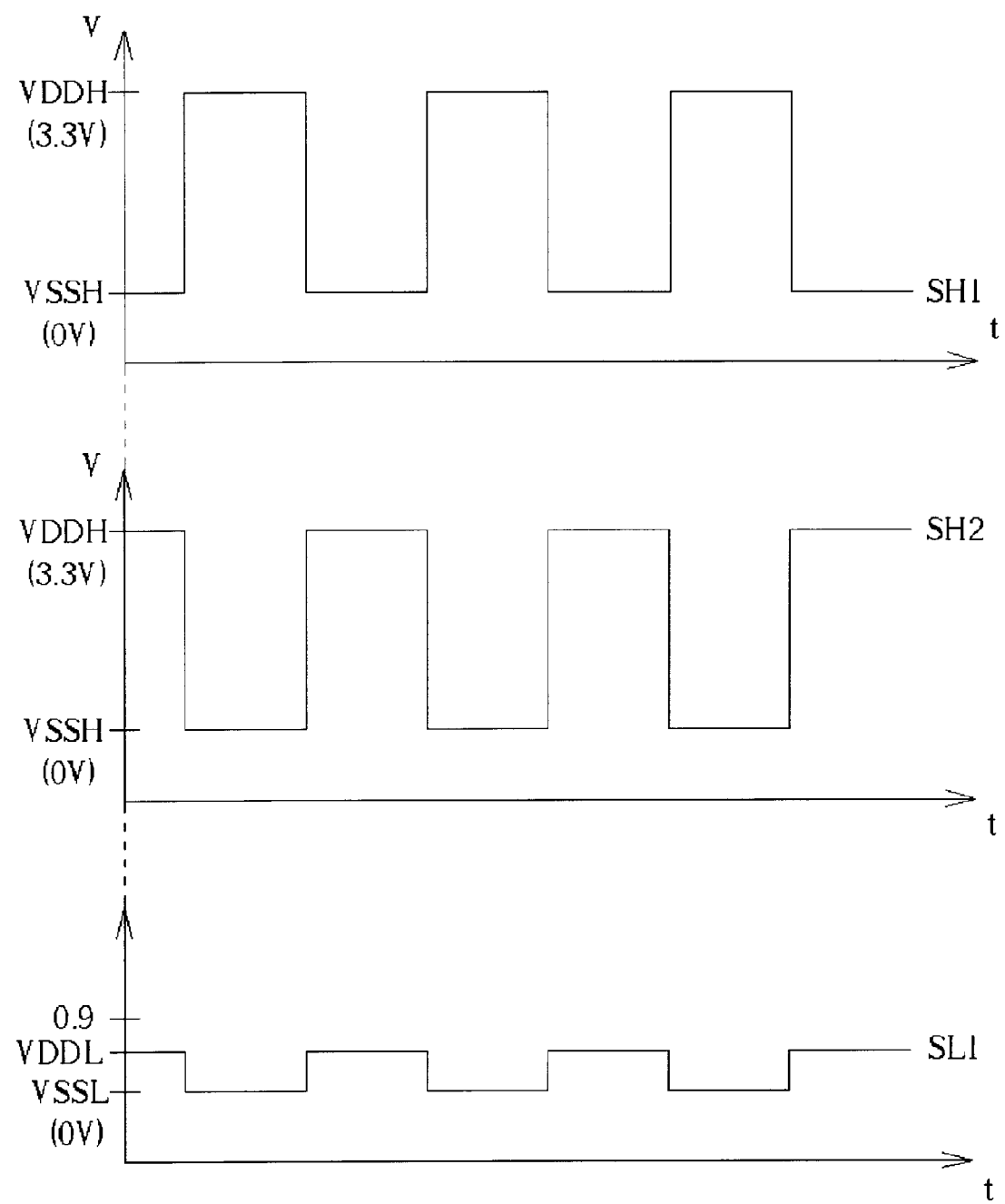
FIG. 6 is an example of logic signals in FIG. 5.

Please refer to FIG. 6, an example of logic signals in FIG. 5 is illustrated. From FIG. 6 it can be seen that, under circumstances described above, logic signals can pass through the high-to-low level shifter 500 correctly.

Figure 7:
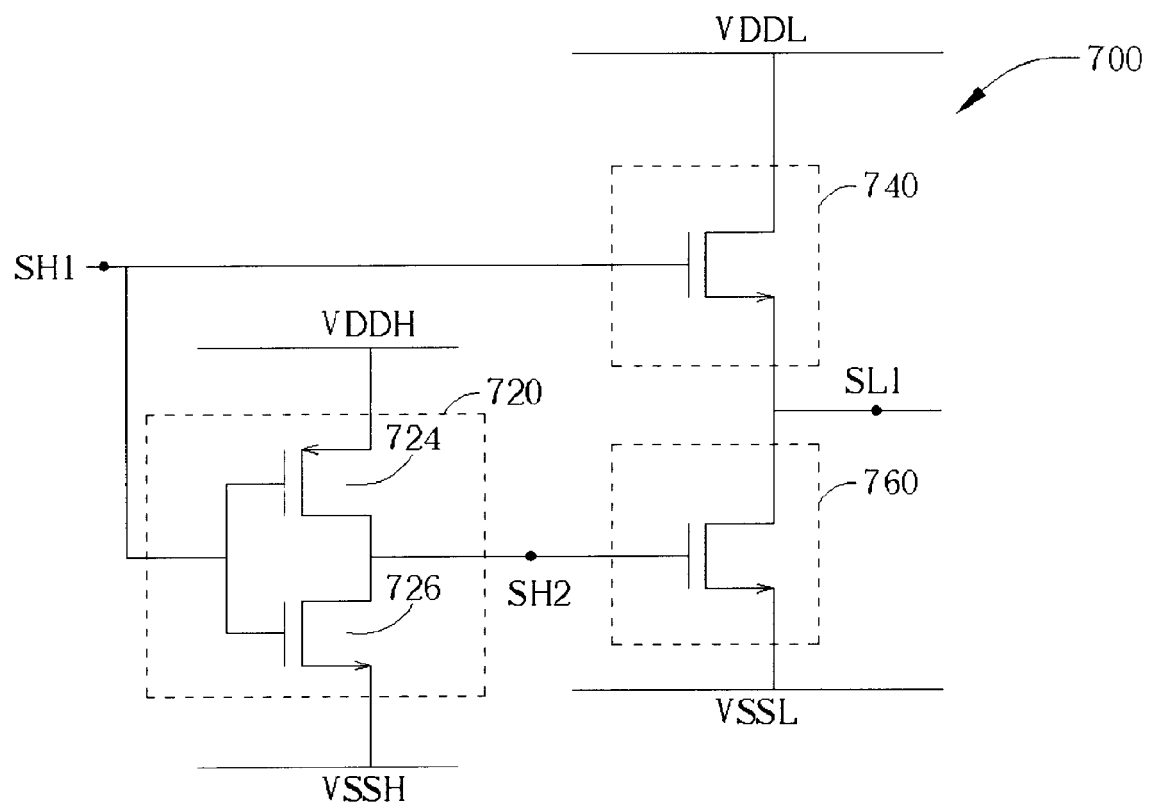
FIG. 7 is a circuit diagram of a high-to-low level shifter according to another embodiment of the present invention.
Figure 8:
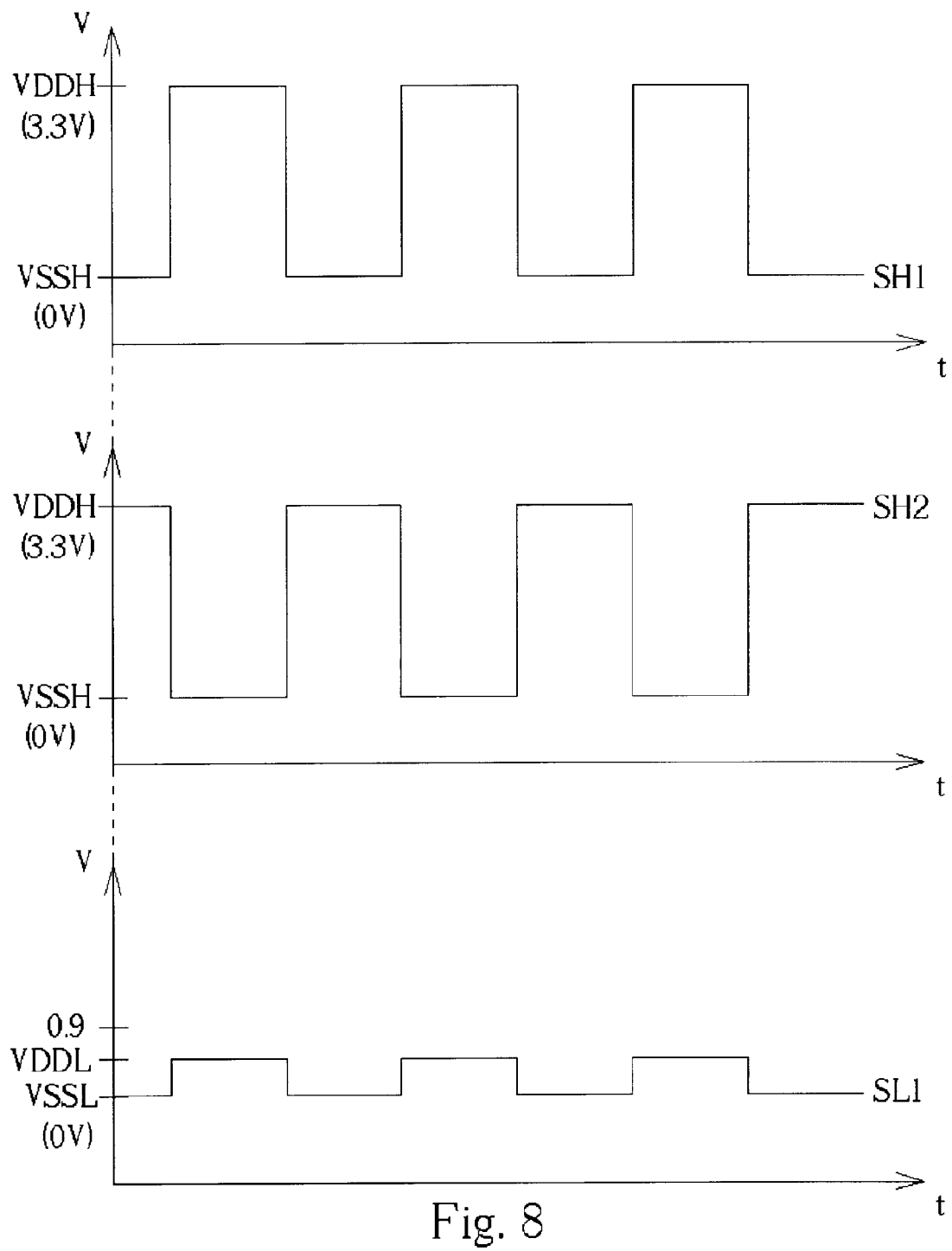
FIG. 8 is an example of logic signals in FIG. 7.

Please refer to FIG. 7, a second embodiment circuit diagram of a high-to-low level shifter of the present invention is illustrated. The difference between FIG. 7 and FIG. 5 is that in FIG. 7 the pull-up element (that is, the high-voltage NMOS transistor 740) coupled to the external first signal SH1, and the pull-down element (that is, the high-voltage NMOS transistor 760) coupled to the external second signal SH2 outputted by the inverter 720. The operating principle of the circuit of FIG. 7 is essentially similar to that of the circuit of FIG. 5, and as a result logic signals can pass through the high-to-low level shifter 700 even when VDDL is smaller than 0.9V. Please note that in FIG. 5 the phase of the external first signal SH1 is inverse to the internal signal SL1, while in FIG. 7 the external first signal SH1 has the same phase as the internal signal SL1. FIG. 8 is an example of logic signals of FIG. 7.

The high-to-low level shifter according to embodiments of the present invention can pass logical signals correctly even thought the operating voltage of the integrated circuit becomes smaller and smaller. In other words, logic signal in the external circuit with high operating voltage can be shifted to logic signals in the integrated circuit with low operating voltage correctly.

Those skilled in the art will readily observe that numerous modification and alternation of the device may be made while retaining the teaching of the invention. Accordingly, the above disclosure should be construed as limited only by the metes and bounds of the appended claims.

What is claimed is:

1. A high-to-low level shifter being coupled to a first voltage and a second voltage, wherein the first voltage is larger than the second voltage, the high-to-low level shifter comprising:

an inverter for receiving an input signal and generating an inverse input signal, wherein the inverter operates at the first voltage; and a level shifter for generating an output signal according to the input signal and the inverse input signal, the level shift comprising a pull-up unit for receiving the input signal and a pull-down unit for receiving the inverse input signal, wherein the level shifter operates at the second voltage, the logic level of the output signal corresponds to the second voltage, the logic value of the output signal corresponds to the input signal, and the pull-up unit and the pull-down unit are coupled to the output signal.

2. The high-to-low level shifter of claim 1, wherein the pull-up unit is an NMOS transistor.

3. The high-to-low level shifter of claim 1, wherein the pull-down unit is an NMOS transistor.

4. The high-to-low level shifter of claim 1, wherein both the pull-up unit and the pull-down unit are high voltage devices.

5. The high-to-low level shifter of claim 1, wherein the level shifter is set inside an integrated circuit.

6. The high-to-low level shifter of claim 1, wherein the inverter is set outside an integrated circuit.

7. A high-to-low level shifter comprising:

a first transistor for receiving a first input signal; and a second transistor for receiving a second input signal which is the inverse of the first input signal, wherein the first transistor and the second transistor are coupled to an output end for outputting an output signal, the logic value of the output signal corresponds to the first input signal and the second input signal;

wherein the logic level of the first input signal and the second input signal correspond to a first voltage, the logic level of the output signal corresponds to a second voltage, and the first voltage is larger than the second voltage.

8. The high-to-low level shifter of claim 7, wherein both the first transistor and the second transistor are NMOS transistors.

9. The high-to-low level shifter of claim 7, wherein the first transistor and the second transistor operate at the second voltage.

10. The high-to-low level shifter of claim 7, wherein the first transistor is coupled to the second voltage.

11. The high-to-low level shifter of claim 7, wherein the high-to-low level shifter is set inside an integrated circuit.

12. The high-to-low level shifter of claim 7, wherein the first voltage is 3.3V.

13. The high-to-low level shifter of claim 7, wherein the second voltage is less than 0.9V.

14. A high-to-low level shifter being coupled to a first voltage and a second voltage, wherein the first voltage is larger than the second voltage, the high-to-low level shifter comprising:

an inverter for receiving an input signal and generating an inverse input signal, wherein the inverter operates at the first voltage; and a level shifter for generating an output signal according to the input signal and the inverse input signal, the level shifter comprising a pull-up unit and a pull-down unit, wherein the level shifter operates at the second voltage, the logic level of the output signal corresponds to the second voltage, the logic value of the output signal corresponds to the input signal, and both the pull-up unit and the pull-down unit are high voltage devices.

15. The high-to-low level shifter of claim 14, wherein the pull-up unit is for receiving the input signal, the pull-down unit is for receiving the inverse input signal, and the pull-up unit and the pull-down unit are coupled to the output signal.

16. The high-to-low level shifter of claim 14, wherein the pull-up unit is for receiving the inverse input signal, the pull-down unit is for receiving the input signal, and the pull-up unit and the pull-down unit are coupled to the output signal.

17. The high-to-low level shifter of claim 14, wherein the pull-up unit is an NMOS transistor.

18. The high-to-low level shifter of claim 14, wherein the pull-down unit is an NMOS transistor.

19. The high-to-low level shifter of claim 14, wherein the level shifter is set inside an integrated circuit.

20. The high-to-low level shifter of claim 14, wherein the inverter is set outside an integrated circuit.

21. A high-to-low level shifter being coupled to a first voltage and a second voltage, wherein the first voltage is larger than the second voltage, the high-to-low level shifter comprising:

an inverter for receiving an input signal and generating an inverse input signal, wherein the inverter operates at the first voltage, and the inverter is set outside an integrated circuit; and a level shifter for generating an output signal according to the input signal and the inverse input signal, wherein the level shifter operates at the second voltage, the logic level of the output signal corresponds to the second voltage, and the logic value of the output signal corresponds to the input signal.

22. The high-to-low level shifter of claim 21, wherein the level shifter comprises a pull-up unit and a pull-down unit.

23. The high-to-low level shifter of claim 22, wherein the pull-up unit is for receiving the input signal, the pull-down unit is for receiving the inverse input signal and the pull-up unit and the pull-down unit are coupled to the output signal.

24. The high-to-low level shifter of claim 22, wherein the pull-up unit is for receiving the inverse input signal, the pull-down unit is for receiving the input signal and the pull-up unit and the pull-down unit are coupled to the output signal.

25. The high-to-low level shifter of claim 22, wherein the pull-up unit is an NMOS transistor.

26. The high-to-low level shifter of claim 22, wherein the pull-down unit is an NMOS transistor.

27. The high-to-low level shifter of claim 22 wherein both the pull-up unit and the pull-down unit are high voltage devices.

28. The high-to-low level shifter of claim 21, wherein the level shifter is set inside an integrated circuit.

* * * * *